United States Patent [19]
Hoshi

[11] Patent Number: 5,352,625
[45] Date of Patent: Oct. 4, 1994

[54] METHOD OF MANUFACTURING SEMICONDUCTOR SUBSTRATE

[75] Inventor: Tadahide Hoshi, Yokohama, Japan

[73] Assignee: Kabushiki Kaisha Toshiba, Kawasaki, Japan

[21] Appl. No.: 800,074

[22] Filed: Nov. 29, 1991

[30] Foreign Application Priority Data

Nov. 30, 1990 [JP] Japan .................. 2-336706

[51] Int. Cl.$^5$ ............................. H01L 21/76
[52] U.S. Cl. ..................... 437/67; 437/62; 437/68; 437/64; 437/974; 148/DIG. 50
[58] Field of Search ............ 437/61, 62, 67, 68, 437/974, 225; 148/DIG. 50

[56] References Cited

U.S. PATENT DOCUMENTS

| | | |
|---|---|---|
| 3,979,237 | 9/1976 | Morcom et al. |
| 4,255,207 | 3/1981 | Nicolay et al. ............ 437/79 |
| 4,948,742 | 8/1990 | Nishimura et al. |
| 5,097,314 | 3/1992 | Nakagawa et al. ............ 437/974 |

FOREIGN PATENT DOCUMENTS 0398468  2/1990  European Pat. Off.

OTHER PUBLICATIONS

Research Disclosure No. 306, 1989, Havant GB, p. 743 'Method For Producing Planarized.
Y. Ohta et al. "Dielectrically Isolated Intelligent Power Switch", IEEE 1987 Custom Integrated Circuits Conference pp. 443–446.
J. Ohura et al. "Dielectrically Isolated Photodiode Array by Silicon Wafer Direct Bonding", IEEE Electron Device Letter, vol. EDL-8 n10. '87 p. 454.
T. Hamaguchi et al. "Novel LSI/SOI Wafer Fabrication Using Device Layer Transfer Technique", IEDM 85 pp. 688–691.
Research Disclosure No. 306, 1989, Havant GB, p. 743 'Method For Producing Planarized.

*Primary Examiner*—Tom Thomas
*Assistant Examiner*—Trung Dang
*Attorney, Agent, or Firm*—Foley & Lardner

[57] ABSTRACT

In manufacturing a semiconductor substrate having a dielectric isolation structure, a dielectric film is formed at a semiconductor layer formed by epitaxial growth. Grooves for carrying out dielectric isolation to deposit filler thereon thereafter are used to polish the deposited filler. The polishing condition is obeyed where polishing rate ratio of the filler to the dielectric film is one fifth or less. Thus, an active semiconductor layer in which where elements are to be formed can be provided with good productivity, state where the flatness thereof is good and the layer thickness is uniformly and precisely controlled.

3 Claims, 3 Drawing Sheets

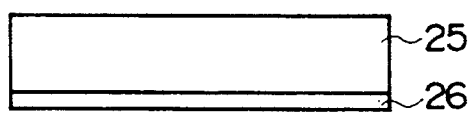
FIG. IA
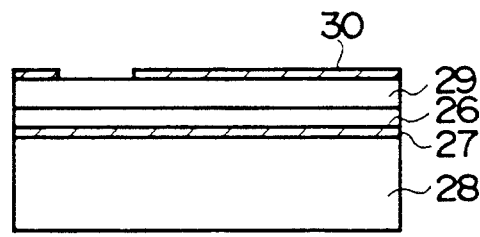
FIG. IE
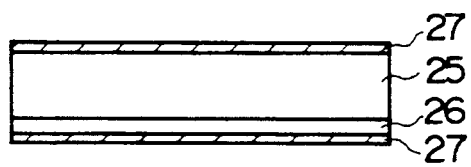
FIG. IB
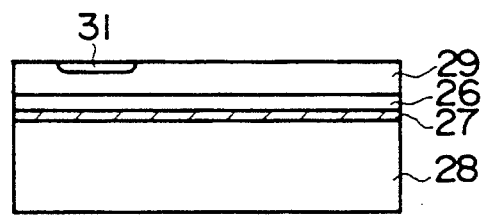
FIG. IF
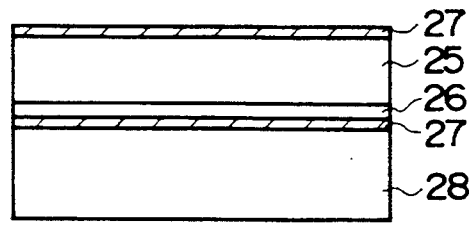
FIG. IC
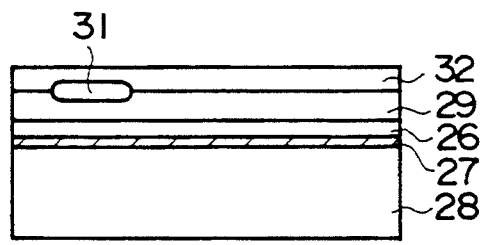
FIG. IG
FIG. ID
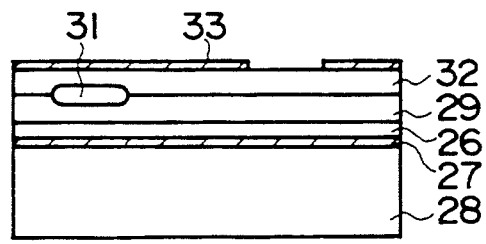
FIG. IH

METHOD OF MANUFACTURING SEMICONDUCTOR SUBSTRATE

BACKGROUND OF THE INVENTION

This invention relates to a method of manufacturing a semiconductor substrate, and more particularly to a method of manufacturing a semiconductor substrate applied to a semiconductor device having, e.g., a dielectric isolation structure.

Hitherto, in forming circuit elements of a semiconductor integrated circuit, in order to form circuit elements isolated from other circuit elements to form an island, a dielectric isolation system of a structure in which, e.g., each periphery (side surface and bottom surface) of the circuit elements is perfectly enclosed by a dielectric substance has been proposed. In accordance with the P-N junction isolation system having such a structure, the element isolation withstand voltage has been able to take more than 500 volts, whereas that withstand voltage could not take more than 200 volts according to the technologies prior thereto. Thus, this isolation system is advantageous, in that it is free from the problem of latch-up phenomenon taking place by the parasitic element operation, and that high integration is easy. For this reason, such a dielectric isolation system has been frequently used.

FIG. 4 is a cross section of an a semiconductor device having such a dielectric isolation structure. A semiconductor active layer is formed in a semiconductor layer 2 on the upper layer side of a first semiconductor substrate 1, and an insulating film (dielectric film) 3, e.g., silicon dioxide ($SiO_2$) is formed on the lower layer side thereof. Furthermore, a second semiconductor substrate 4 is bonded to the first semiconductor substrate 1 in a manner that it serves as a underlying layer of the insulating film 3. More particularly, within the semiconductor layer 2 and an overlying layer, i.e., a layer formed thereabove, the essential parts of circuit elements 5 and 6 are formed. Within the semiconductor layer 2, a high concentration, i.e., heavily doped p-type silicon layer 7, a p-type silicon layer 8, and an n-type silicon layer 9 are formed in the a manner stacked in order recited.

It is to be noted that a high concentration n-type silicon layer 10 is formed as a buried layer at a portion between the p-type silicon layer 8 and the n-type silicon layer 9. Further, a p-type silicon layer 11, a high concentration n-type silicon layer 12 and a high concentration p-type silicon layer 13 are formed in a manner spaced from each other at the surface portion of the n-type silicon layer 9, and high concentration n-type silicon layer 14 and 15 are formed at the surface portions of the p-type silicon layer 11 and the high concentration p-type silicon layer 13 and within their regions, respectively.

Moreover, the circuit elements 5 and 6 are isolated at their bottom surfaces by the insulating film 3. Furthermore, the circuit elements 5 and 6, and adjacent other circuit elements are isolated at their side surfaces by providing grooves on all sides thereof. Namely, respective circuit elements are isolated by surrounding the peripheral portions thereof by means of a structure like a wall such that those circuit elements are surrounded by insulating films (dielectric films), respectively including polycrystalline silicon layers therein, 16 and 17, e.g., $SiO_2$ along both the side surfaces of the grooves provided on all sides, and that polycrystalline silicon layers 18 are formed in the respective grooves.

It is point particularly important for a semiconductor substrate in forming a semiconductor device having such a dielectric isolation structure is that the surface flatness of the semiconductor layer 2, especially the n-type silicon layer 9 serving as the uppermost semiconductor layer where the essential parts of the circuit elements are directly formed is satisfactory, and that the film thickness is uniformly and precisely controlled. For example, when a predetermined thickness of this layer is assumed to be, e.g., 15 $\mu$m, it is desirable that unevenness be within ±5%, i.e., ±0.75 $\mu$m. In the case where the accuracy of this semiconductor layer thickness is poor, the characteristics of the circuit elements do not become uniform, and/or isolation between circuit elements cannot be completely carried out, so the element isolation withstand voltage cannot take a sufficiently large value. As a result, an adverse influence may be placed by adjacent elements conducting undesirably.

Meanwhile, in order to manufacture such a conventional semiconductor substrate, an approach is employed to form, within the semiconductor layer 2, high concentration p-type silicon layer 7, p-type silicon layer 8 and n-type silicon layer 9, as shown in FIG. 4, to form grooves thereafter to deposit polysilicon layers so that those grooves are sufficiently filled with such layers to regulate or adjust the thickness of the n-type silicon layer 9 of the uppermost layer by grinding. This grinding is carried out ordinarily at two stages, rough grinding and finish grinding.

In a conventional semiconductor substrate formed in accordance with such a manufacturing method, even if substrates having good flatness are used for the first semiconductor substrate 1 and the second semiconductor substrate 4, unevenness thickness becomes great because the n-type silicon layer 9 is formed by grinding.

The distribution of unevenness by the conventional method is shown at the right side portion of FIG. 3. In this figure, the internal unevenness is taken on the abscissa and the frequency is taken on the ordinate. In the case of a semiconductor substrate by the above-mentioned conventional method, when the thickness of the n-type silicon layer 9 is formed so that the diameter is 100 mm and a predetermined thickness of 15 $\mu$m is measured, the internal unevenness takes a large value of 3 $\mu$m (±10) even if a good sample is taken, and the range of unevenness is also broad. At this time, the mean value of the internal distribution of the unevenness value is 4 $\mu$m (±13.3%). In accordance with such a conventional method, it is extremely difficult to provide a semiconductor substrate such that the internal unevenness falls within ±5% for realizing a perfect dielectric isolation structure.

In addition, in order to form an n-type silicon layer 9 of a predetermined thickness, it is required to additionally and thickly grow an epitaxial layer in excess of a predetermined thickness, e.g., 15 $\mu$m by 40 $\mu$m as a machining clearance for grinding or polishing at the succeeding process steps. As a result, it takes much time, resulting in lowered throughput. This causes costs to increase.

SUMMARY OF THE INVENTION

Accordingly, an object of this invention is to provide a method of manufacturing a semiconductor substrate having good productivity in which a semiconductor layer where the active region serving as the essential part of circuit elements is directly formed, can be formed in a manner that the flatness thereof is good, and the film thickness is uniformly and precisely controlled.

According to the present invention, there is provided a method of manufacturing a semiconductor substrate comprising: a first step of bonding first and second semiconductor substrates in a manner that a first dielectric film formed on at least one surface of the semiconductor substrates is placed therebetween, a second step of polishing the surface of the bonded first semiconductor substrate to decrease the thickness of the first semiconductor substrate thus to form a first semiconductor layer having a predetermined thickness, a third step of forming a second semiconductor layer having a predetermined thickness on the first semiconductor layer by epitaxial growth, a fourth step of forming, in the first and second semiconductor layers, a groove having a depth from the surface of the second semiconductor layer down to the first dielectric film to form a second dielectric film on the side surfaces of the groove and the upper surface of the second semiconductor layer, a fifth step of completely filling the grooves with a filler and depositing the filler on the second dielectric film, a sixth step of polishing and removing the filler, where the ratio between the polishing rate for the second dielectric film and the polishing rate for the filler is less than 1/5, thus, to allow the second dielectric film on the second semiconductor layer to be exposed, and a seventh step of removing the second dielectric film on the second semiconductor layer exposed at the sixth step.

In accordance with this invention, in manufacturing a semiconductor substrate having a dielectric isolation structure, a dielectric film at a semiconductor layer is formed by epitaxial growth and grooves for carrying out dielectric isolation to deposit fillers or filling materials thereon, and thereafter to polish the deposited fillers by using the polishing condition that the polishing rate ratio of the filler to the dielectric film is set to a value less than one fifth. Thus, an active semiconductor layer where elements are to be formed can be provided with good productivity under the state where the flatness thereof is good and the layer thickness is uniformly and precisely controlled.

BRIEF DESCRIPTION OF THE DRAWINGS

In the accompanying drawings;

FIGS. 1A to 1M are cross sectional views of the process steps showing an embodiment of this invention.

DESCRIPTION OF THE PREFERRED EMBODIMENT

Figure 1I:
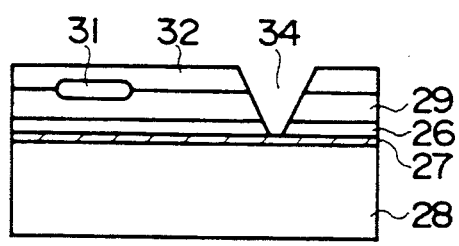

In FIG. 1A, boron (B) is ion-implanted into at least one mirror-polished surface of a first p-type silicon substrate 25, e.g., having a diameter of 125 mm, a thickness of 625 $\mu$m, a crystal orientation of (100), and a resistivity of 90 to 100 $\Omega$.cm under the condition of an acceleration voltage of 40 KeV and dose of $2\times10^{15}$ cm$^{-2}$ to form a high concentration p-type silicon layer 26 of a desired layer thickness.

In FIG. 1B, the p-type silicon substrate 25 on which the high concentration p-type silicon layer 26 is formed is oxidized to form insulating films (dielectric films) 27 of silicon dioxide (SiO$_2$) having a thickness of 1 $\mu$m on both surfaces thereof.

In FIG. 1C, the surface of the insulating film 27 on the side where the high concentration p-type silicon layer 26 is formed with at least one mirror-polished surface of a second semiconductor substrate 28, e.g., an n-type silicon substrate having a diameter of 125 mm, a thickness of 625 $\mu$m, a crystal orientation of (100), and a resistivity of 1 to 100 $\Omega$.cm (in the case where silicon wafer is used, there is no limit in crystal orientation, resistivity, and shape, etc.) i.e., the mirror-polished surfaces are bonded to each other at room temperature. Thereafter, thermal treatment is implemented for two hours in the gas atmosphere of N$_2$: O$_2$4:1 (volume ratio) at 1100° C., thus, to bond the p-type silicon substrate 25 and the second semiconductor substrate 28. It is to be noted that this bonding may be carried out in vacuum or by the electrostatic pressure method of applying a pulse voltage across both the substrates.

In FIG. 1D, rough grinding processing is applied to the p-type silicon substrate 25 by means of a grinder, etc. from the surface side of the exposed insulating film 27, and mirror-polishing processing is then implemented, e.g., by mechano-chemical polishing used for mirror-processing of an ordinary silicon substrate to form a p-type silicon layer 29. By this processing, a high concentration p-type silicon layer 26 and a p-type silicon layer 29 are formed on the insulating film 27 to which the second semiconductor substrate 28 is bonded so that the layer thickness in total becomes equal to 40 $\mu$m.

In FIG. 1E, resist is coated on the upper surface of the p-type silicon layer 29. Then, patterning is implemented thereto to form a resist layer 30 where a predetermined pattern is formed by well known means.

In FIG. 1F, impurity diffusion is implemented to the opened region of the resist layer 30 by an ordinary diffusion process using a solid diffusion source of antimony oxide (Sb$_2$O$_3$). Namely, in the N$_2$ gas atmosphere, impurity diffusion is carried out under the condition of 1250° C. and 60 minutes (the solid diffusion source is held at 950° C.). Thus, a high concentration n-type silicon layer 31 having a sheet resistance of 20 $\Omega$/□ is formed. Thereafter, the resist layer 30 is removed.

In FIG. 1G, a low concentration n-type silicon layer 32 is epitaxially grown on the upper surface of the p-type silicon layer 29 and the high concentration n-type silicon layer 31. Namely, trichlorosilan (SiHCl$_3$) gas is thus used to epitaxially grow a low concentration n-type silicon layer 32 having a layer thickness of 15 $\mu$m, and a resistivity of 7 to 9 $\Omega$/cm at 1140° C.

In FIG. 1H, a resist layer 33 where a predetermined pattern is formed is formed on the upper surface of the low concentration n-type silicon layer 32 by using well known means.

In FIG. 1I, the low concentration n-type silicon layer 32, the p-type silicon layer 29, and the high concentration p-type silicon layer 26 are etched from the upper surface down to the upper portion of the insulating film 27 by using KOH-system etchant to form a V-groove 34 thereafter to remove the resist layer 33.

Figure 1L:
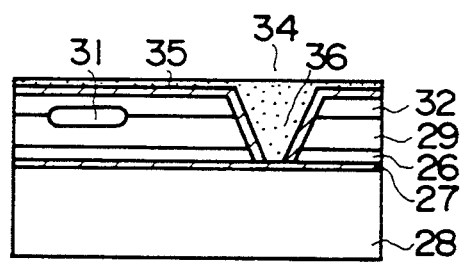
Figure 1J:
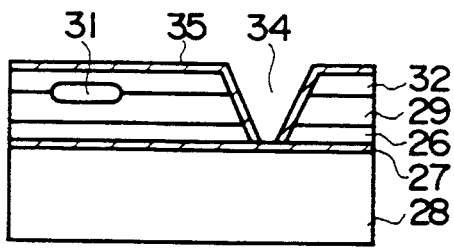

In FIG. 1J, the side wall surfaces of the V groove 34 and the upper surface of the low concentration n-type silicon layer 32 are thermally oxidized to form an insulating film (dielectric film) 35 of SiO$_2$ having a thickness of 1 $\mu$m.

Figure 1M:
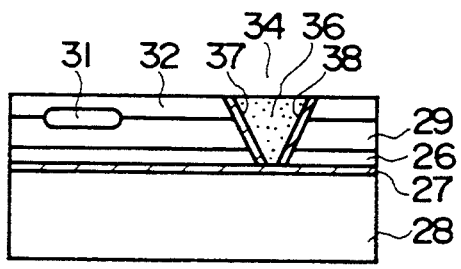
Figure 1K:
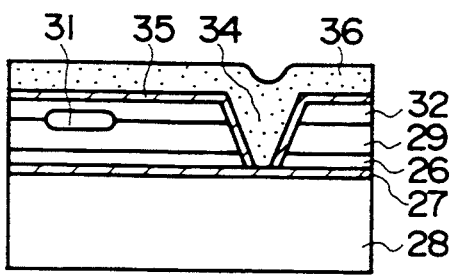

In FIG. 1K, a polycrystalline silicon layer 36 is deposited on the entire upper surface portion of the insulating film 35 on the low concentration n-type silicon layer 32 so that the internal portion of the V groove 34 on which the insulating film 35 is formed is completely filled with the silicon layer 36. Namely, SiHCl₃ gas is used to deposit the polycrystalline silicon layer 36 having a layer thickness of 80 μm by using CVD process, etc. at 1100° C.

In FIG. 1L, rough grinding processing is carried out in a horizontal direction by means of grinder, etc. until the layer thickness of the polycrystalline layer 36 on the insulation film 35 formed on the low concentration n-type silicon layer 32 becomes equal to 10 μm. This processing is implemented to such an extent that the internal unevenness of the thickness of the polycrystalline silicon layer 36 at this time is 5 μm or less.

Thereafter, the surface of the polycrystalline silicon layer 36 roughly ground is subjected to mirror polishing processing, e.g., by mechano-chemical polishing used in mirror polishing processing for an ordinary silicon substrate. This mirror polishing processing is carried out until the polycrystalline silicon layer 36 on the insulating film 35 is removed (FIG. 1M).

In this polishing processing, the polishing condition where the polishing rate ratio (selection ratio) of the polycrystalline silicon to the silicon dioxide is 1/5 or less is preferably used. The reason why such a condition is employed is based on the following finding. Namely, a polycrystalline silicon layer is deposited on a silicon dioxide film having a thickness of 1 μm on a silicon substrate. Then, rough grinding is applied to the upper surface of the polycrystalline silicon layer, so that the internal unevenness is 5 μm or less. Mirror-polishing processing is implemented from the side of the polycrystalline silicon layer subjected to rough grinding as stated above by using respective polishing conditions where the polishing rate ratios are different. The yield in the case where processing can be carried out in a manner that the silicon substrate of the underlying layer is not exposed at this time is experimentally determined.

Figure 2:
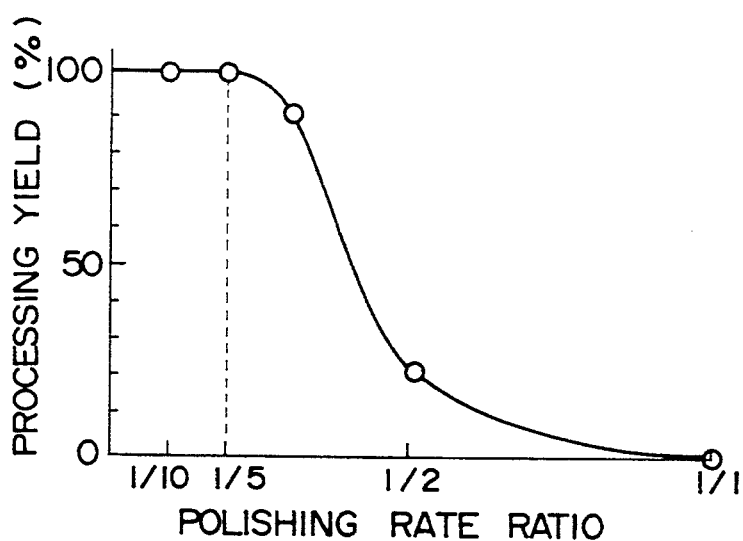
FIG. 2 is a characteristic diagram showing the polishing rate ratio of the polishing material with respect to the processing yield.

In this embodiment, the above-mentioned condition is determined from this finding. Namely, as shown by the graph of FIG. 2 in which the polishing rate ratio between silicon dioxide and polycrystalline silicon is taken on the abscissa and the processing yield is taken on the ordinate, when the polishing rate ratio is 1/5 or less, the polycrystalline silicon layer is entirely removed before the silicon substrate of the underlying layer is exposed, so the processing yield is at a high level of substantially 100%. In contrast, when the polishing rate ratio is above 1/5, silicon dioxide film is partially removed before the polycrystalline layer is entirely removed, so the silicon substrate of the underlying layer will be exposed and polished. Whether or not the polycrystalline silicon layer is entirely removed can be easily discriminated at the processing step, and the polishing rate ratio is set to a value less than 1/5. If such a condition is satisfied, it is possible to precisely determine the end point of polishing by the control of time.

Such a polishing rate ratio is greatly influenced by the kind of the polishing material, but processing pressure and/or rotation speed in the polishing machine are also an important factor for the polishing rate ratio. Accordingly, it is necessary to select the polishing condition where these factors are synthetically taken into consideration.

In FIG. 1M, the insulating film 35 on the low concentration n-type silicon layer 32 is removed by using hydrogen fluoride (HF).

Thus, there is formed an isolation section of a dielectric isolation structure in which insulating films 37 and 38 are formed on the side surfaces of the V groove 34, and the polycrystalline silicon layer 36 is formed within the V groove 34.

Figure 4:
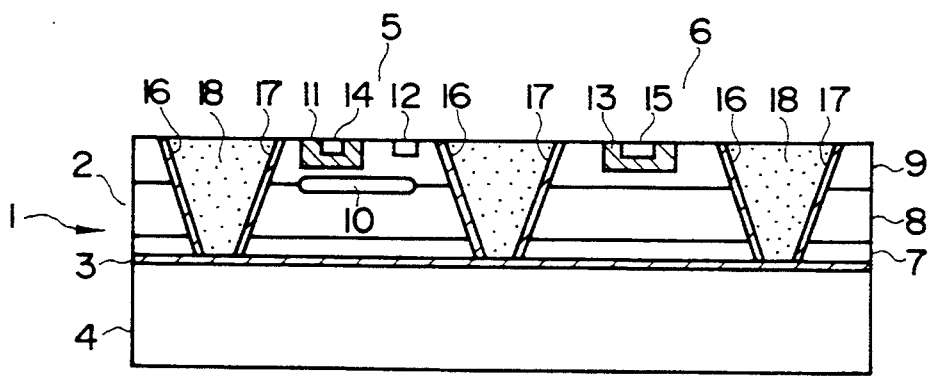
FIG. 4 is a cross sectional view showing a semiconductor device having a dielectric isolation structure.

By undergoing the above-mentioned process steps, a semiconductor substrate is provided, in which the low concentration n-type silicon layer 32 having a predetermined layer thickness, or the like is formed. By using this semiconductor substrate, elements are formed as shown in FIG. 4.

The low concentration n-type silicon layer 32 thus obtained is featured below. Namely, because a layer formed on the p-type silicon layer 29 is subjected to mirror-polishing processing, with good flatness and in a manner that the thickness thereof is uniformly and precisely controlled is used as it is, the layer thickness of the low concentration n-type silicon layer 32 thus obtained is uniform and accurate.

Figure 3:
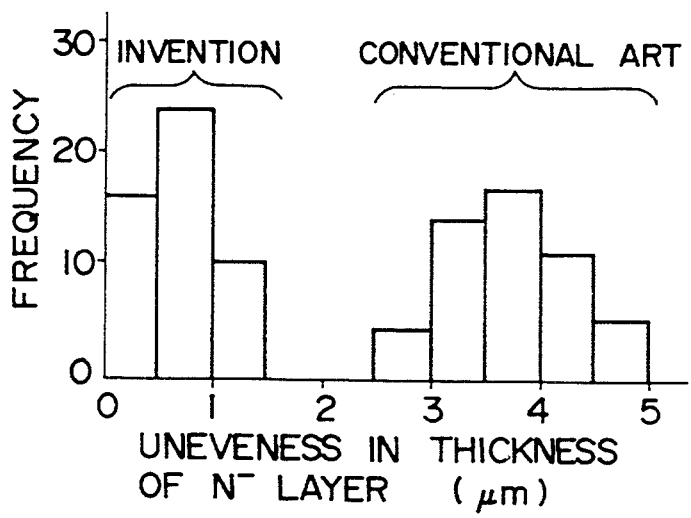
FIG. 3 is a characteristic diagram showing the internal unevenness in thickness versus frequency.

Furthermore, in order to experimentally confirm this, the thickness of the low concentration n-type silicon layer 32 and the internal unevenness thereof are measured in connection with 50 semiconductor substrates provided by undergoing the above-mentioned process steps. The measured result is shown at the left hand side of FIG. 3 in which the internal unevenness is taken on the abscissa and frequency is taken on the ordinate. As seen from the comparison with the prior art, in accordance with semiconductor substrates according to this embodiment, the internal unevenness thereof is 1.5 μm (±5%) or less, even if the internal unevenness is large. This satisfies the level in which the required internal unevenness is less than ±5%. Furthermore, the mean value of the distribution of internal unevenness values is 0.94 μm (±3.13%) and, there is less unevenness.

In addition, in accordance with this method, in order to form a low concentration n-type silicon layer 32 having a layer thickness of 15 μm, it is unnecessary to additionally and thickly grow the epitaxial layer, use a machining clearance for grinding or polishing subsequently. Namely, it is sufficient to carry out epitaxial growth just by a predetermined thickness of 15 μm, with no possibility that costs will increased.

It should be noted that this invention is not limited to the above-described embodiment, but may be carried out in a manner that it can be suitably modified or changed within the range which does not depart from the gist of the invention.

What is claimed is:

1. A method of manufacturing a semiconductor substrate comprising:

a first step of bonding first and second semiconductor substrates to each other so that a first dielectric film formed on at least one surface of one of said semiconductor substrates is placed between said semiconductor substrates, a second step of polishing the exposed surface of said bonded first semiconductor substrate to decrease the thickness of said first semiconductor substrate and form a first semiconductor layer having a thickness, a third step of forming a second semiconductor layer of a thickness on said first semiconductor layer by epitaxial growth, a fourth step of forming, in said first and second semiconductor layers, a groove having a depth extending from the upper surface of said second semiconductor layer to said first dielectric film, a fifth step of forming a second dielectric film on the side surfaces of said groove and on the upper surface of said second semiconductor layer, a sixth step of depositing filler material into said groove to fill said groove and further depositing said filler material on said second dielectric film to form a filler film thereon, a seventh step of grinding said filler film on said second dielectric film to reduce the thickness of said filler film to a thickness, an eighth step of mechano-chemical polishing said filler film on said second dielectric film, wherein the ratio between the polishing rate for said second dielectric film and the polishing rate for said filler film is less than 1/5, to remove said filler film on said second dielectric film and allow said second dielectric film on said second semiconductor layer to be exposed, and a ninth step of removing said second dielectric film on said second semiconductor layer exposed at said eighth step.

2. A method of manufacturing a semiconductor substrate as set forth in claim 1, wherein said filler is polysilicon.

3. A method of manufacturing a semiconductor substrate as set forth in claim 1, which further comprises a step of forming a buried layer between said first and second semiconductor substrates.

* * * * *